United States Patent Office 3,489,564

Patented Jan. 13, 1970

3,489,564
PHOTOLYTIC ETCHING OF SILICON DIOXIDE

Donald L. Schaefer, Schenectady, N.Y., assignor to General Electric Company, a corporation of New York No Drawing. Filed May 29, 1967, Ser. No. 642,159
Int. Cl. G03c *5/00, 15/00*
U.S. Cl. 96—36 3 Claims

ABSTRACT OF THE DISCLOSURE

A process is disclosed whereby the surface of a body of silicon dioxide is placed in contact with a liquid comprising a photodecomposable fluorine compound and the interface exposed to a pattern of activating radiation to produce chemically reactive fluoro-species whereby the silicon dioxide surface is preferentially etched in the illuminated areas.

This invention relates to the etching of surfaces composed essentially of silicon dioxide such as, for example, quartz, quartz glass and the high silicate glasses by photolyzing a liquid reagent in contact therewith to produce chemically reactive species which attack the surface at the liquid-solid interface.

BACKGROUND OF THE INVENTION

In the past when it has been desired to etch the surface of glass or quartz materials to form patterns therein for either decorative or optical purposes, it has been necessary to coat those areas of the surfaces which are not to be etched with a protective layer of a material which is resistant to the etchant, leaving exposed those areas which are to be etched. The etchant, usually hydrofluoric acid or a solution with ammonium fluoride is then applied and etching of the surface is accomplished in those exposed areas. Where a high degree of precision is necessary in forming the etched pattern as, for example, in the manufacture of optical reticles, it has been conventional to use a suitable "photoresist" process. In general, these processes have involved coating the surface to be etched with a material which, when suitably irradiated, is converted from a soluble to an insoluble material. In practice, the surface to be etched is coated with the material, exposed to the desired pattern of activating radiation through an appropriate photographic negative, for example, and the unexposed still soluble areas of the coating removed by washing with an appropriate solvent, leaving behind the insoluble coating covering the surface areas which were exposed. The unprotected areas of the surface may then be etched with the etchant, after which the photoresist mask is removed. It will be apparent that this process has several inherent disadvantages. The photolytic reaction of the photoresist materials usually involves a polymerization or cross-linking type of reaction and the edge resolution between reacted and unreacted zones is frequently of uncertain quality and may be difficult to reproduce with a high degree of accuracy from one specimen to another. Considerable care must be exercised during the washing and the etching steps to prevent the insoluble portions of the photoresist pattern from lifting from the surface, yet all the soluble material must be removed. Undercutting of the insoluble pattern by the etchant is unavoidable and virtually impossible to control which introduces variations between successively etched patterns. The etchants employed in the etching of silicon dioxide are toxic and in the case of hydrofluoric acid, extremely dangerous to use. It would be advantageous to eliminate the necessity for the use of the photoresist material, the multiple step process attendant therewith and the use of the hazardous etchants.

It is therefore a principal object of this invention to provide a process for etching predetermined patterns in surfaces composed essentially of silicon dioxide which does not require the use of a mask of the photoresist type or highly corrosive and hazardous etchants.

It is a further object of this invention to provide a method for the selective etching of a silicon dioxide surface at controllably different rates in different zones thereof simultaneously.

Other and specifically different objects of this invention will become apparent to those skilled in the art from the following disclosure.

SUMMARY OF THE INVENTION

Briefly stated, this invention provides a method for the selective etching of surfaces composed primarily of silicon dioxide by providing a common interface between the surfaces and a liquid which is photolytically decomposable to form species which are chemically reactive with said surface, exposng said interface to a pattern of activating radiation whereby said chemically reactive species are formed at irradiated areas of said interface and react with said surface to etch said pattern into said surface at a rate which is dependent at least in part upon the intensity of the radiation at any given point on the interface.

DESCRIPTION OF THE PREFERRED EMBODIMENTS

More particularly, the following examples illustrate how the invention may be practiced. In one preferred embodiment of the invention, the silicon dioxide body to be etched comprises at least part of the wall structure of a container adapted to receive the liquid etchant. The silicon dioxide body may be transparent to the activating radiation and may be quartz, for example. It may be a separable body which is temporarily sealed to one side of a container of a different material to form a liquid retentive container for the etchant, or the entire container may be made of the material to be etched. In any event, the etchant is placed within the container and the interface between the silicon dioxide body and the etching liquid is exposed to a pattern of activating radiation for a time sufficient to etch the surface of the body to the desired degree. For example, a quartz tube about 2 inches long having an outside diameter of 0.120 inch with a sidewall thickness of about 0.015 inch and one closed end was filled with fluorobenzene and exposed to a pattern of radiation from a 150 watt high pressure xenon lamp at a distance of about 3 inches for about 15 minutes. When the inner surface of the tube was examined, it was found to be etched in the areas exposed to illumination. The degree or depth of etching is dependent upon the length of exposure and the intensity of the illumination.

Other fluorine compounds which have been found to be photodecomposable to yield chemically reactive species which are effective to etch silicon dioxide surfaces are fluorosulfonyl benzene sulfonylchloride, monofluoroacetone, 4,4′-fluorobenzophenone, methane sulfonyl fluoride, 1-fluoro - 2 - propanol, hexafluorobenzene, trityldifluoroamine and fluoranil are some examples of such materials. In general, these fluoro compounds are characterized as having a fluorine to carbon or a fluorine to nitrogen or a fluorine to nitrogen to fluorine bonded structure in which the bond dissociation energy of the fluorine bond is about 100 kilo-calories per mole or less. In the case of such materials which are solids, saturated solutions are prepared using appropriate solvents. For example, methanol is used with trityldifluoroamine and fluoranil, and water may be used with methane sulfonyl fluoride.

From the foregoing, it will be appreciated that the several specific photodecomposable fluorine compounds disclosed are exemplary only and that it is not intended that the scope of the invention shall be limited thereto or in any other manner except as set forth in the following claims.

What I claim as new and desire to secure by Letters Patent of the United States is:

1. A method for photoetching a surface of transparent body composed primarily of silicon dioxide comprising, the steps of contacting said surface with a body of liquid comprising a photodecomposable fluorine compound containing at least one fluorine atom having a bond dissociation energy of less than 100 kilo-calories per mole to form a liquid-solid interface, exposing said interface to a pattern of activating radiation through said transparent body to produce chemically reactive species at said interface which chemically attack said surface in the illuminated areas whereby said areas are etched and terminating said exposure when said etching is completed.

2. The method set forth in claim 1 wherein said body is composed of quartz.

3. The method set forth in claim 1 wherein said body of liquid comprises a solution of said photodecomposable fluorine compound.

References Cited

UNITED STATES PATENTS

| | | | |
|---|---|---|---|
| 2,841,477 | 7/1958 | Hall | 204—157.1 X |
| 2,875,046 | 2/1959 | Marron et al. | 96—36 X |
| 3,122,463 | 2/1964 | Ligenza et al. | 156—4 |
| 3,255,005 | 6/1966 | Green | 96—36 |
| 3,271,180 | 9/1966 | White | 96—36 X |
| 3,346,384 | 10/1967 | Gaynor | 96—36 |

GEORGE F. LESMES, Primary Examiner

R. E. MARTIN, Assistant Examiner

U.S. Cl. X.R.

96—36.2; 156—4